(12) United States Patent
Chiang et al.

(10) Patent No.: US 11,205,594 B2
(45) Date of Patent: *Dec. 21, 2021

(54) FIN SPACER PROTECTED SOURCE AND DRAIN REGIONS IN FINFETS

(71) Applicant: Taiwan Semiconductor Manufacturing Co., Ltd., Hsinchu (TW)

(72) Inventors: Kuo-Cheng Chiang, Zhubei (TW); Ting-Hung Hsu, MiaoLi (TW); Chao-Hsiung Wang, Hsinchu (TW); Chi-Wen Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/895,345

(22) Filed: Jun. 8, 2020

(65) Prior Publication Data
US 2020/0303258 A1 Sep. 24, 2020

Related U.S. Application Data

(60) Continuation of application No. 15/911,488, filed on Mar. 5, 2018, now Pat. No. 10,679,900, which is a
(Continued)

(51) Int. Cl.
*H01L 29/165* (2006.01)
*H01L 21/8234* (2006.01)
*H01L 27/088* (2006.01)
*H01L 21/8238* (2006.01)
*H01L 21/84* (2006.01)
*H01L 29/66* (2006.01)
(Continued)

(52) U.S. Cl.
CPC .. *H01L 21/823431* (2013.01); *H01L 21/0217* (2013.01); *H01L 21/02532* (2013.01);
(Continued)

(58) Field of Classification Search
CPC ............ H01L 27/0886; H01L 27/0924; H01L 27/1211; H01L 29/165; H01L 29/66545;
(Continued)

(56) References Cited

U.S. PATENT DOCUMENTS 6,198,142 B1 3/2001 Chau et al.
6,359,311 B1 3/2002 Colinge et al.
(Continued)

FOREIGN PATENT DOCUMENTS

CN 103247535 A 8/2013
KR 1020050087541 A 8/2005
(Continued)

OTHER PUBLICATIONS

Gas, P. et al, "Diffusion of Sb, Ga, Ge, and (As) in TiSi2," Journal of Applied Physics, vol. 63, No. 11, Jun. 1, 1988, pp. 5335-5345.
(Continued)

*Primary Examiner* — Timor Karimy
(74) *Attorney, Agent, or Firm* — Slater Matsil, LLP (57) ABSTRACT

A method includes forming Shallow Trench Isolation (STI) regions in a semiconductor substrate and a semiconductor strip between the STI regions. The method also include replacing a top portion of the semiconductor strip with a first semiconductor layer and a second semiconductor layer over the first semiconductor layer. The first semiconductor layer has a first germanium percentage higher than a second germanium percentage of the second semiconductor layer. The method also includes recessing the STI regions to form semiconductor fins, forming a gate stack over a middle portion of the semiconductor fin, and forming gate spacers on sidewalls of the gate stack. The method further includes forming fin spacers on sidewalls of an end portion of the semiconductor fin, recessing the end portion of the semi-
(Continued)

conductor fin, and growing an epitaxial region over the end portion of the semiconductor fin.

20 Claims, 11 Drawing Sheets

Related U.S. Application Data continuation of application No. 14/851,535, filed on Sep. 11, 2015, now Pat. No. 9,935,011, which is a division of application No. 14/056,649, filed on Oct. 17, 2013, now Pat. No. 9,147,682.

(51) Int. Cl.
| | |
|---|---|
| H01L 27/092 | (2006.01) |
| H01L 27/12 | (2006.01) |
| H01L 29/78 | (2006.01) |
| H01L 21/02 | (2006.01) |
| H01L 21/306 | (2006.01) |
| H01L 21/311 | (2006.01) |
| H01L 21/762 | (2006.01) |

(52) U.S. Cl.
CPC .. *H01L 21/02576* (2013.01); *H01L 21/30604* (2013.01); *H01L 21/31111* (2013.01); *H01L 21/76224* (2013.01); *H01L 21/823437* (2013.01); *H01L 21/823468* (2013.01); *H01L 21/823481* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/165* (2013.01); *H01L 29/66545* (2013.01); *H01L 29/66795* (2013.01); *H01L 29/785* (2013.01); *H01L 29/7848* (2013.01); *H01L 21/02236* (2013.01); *H01L 21/02255* (2013.01); *H01L 21/31116* (2013.01)

(58) Field of Classification Search
CPC .......... H01L 29/66795; H01L 29/7848; H01L 29/785; H01L 21/823431; H01L 21/0217; H01L 21/02532; H01L 21/02576; H01L 21/30604; H01L 21/31111; H01L 21/76224; H01L 21/823437; H01L 21/823468; H01L 21/823481; H01L 21/823821; H01L 21/845; H01L 21/02236; H01L 21/02255; H01L 21/3116
See application file for complete search history.

(56) References Cited

U.S. PATENT DOCUMENTS

| | | | |
|---|---|---|---|
| 6,475,869 B1 | 11/2002 | Yu | |
| 7,078,299 B2 | 7/2006 | Maszara et al. | |
| 7,449,733 B2 | 11/2008 | Inaba et al. | |
| 7,525,160 B2 | 4/2009 | Kavalieros et al. | |
| 7,741,182 B2 | 6/2010 | Van Noort et al. | |
| 8,362,572 B2 | 1/2013 | Huang et al. | |
| 8,642,409 B2 | 2/2014 | Nakazawa | |
| 8,723,272 B2 | 5/2014 | Liu et al. | |
| 9,525,068 B1 | 12/2016 | Gupta et al. | |
| 2005/0077553 A1 | 4/2005 | Kim et al. | |
| 2005/0227435 A1 | 10/2005 | Oh et al. | |
| 2005/0272192 A1 | 12/2005 | Oh et al. | |
| 2006/0065927 A1 | 3/2006 | Thean et al. | |
| 2006/0076625 A1 | 4/2006 | Lee et al. | |
| 2007/0120154 A1 | 5/2007 | Zhu et al. | |
| 2007/0120156 A1 | 5/2007 | Liu et al. | |
| 2007/0267695 A1 | 11/2007 | Lee | |
| 2007/0278585 A1 | 12/2007 | Dyer et al. | |
| 2008/0079094 A1 | 4/2008 | Jin et al. | |
| 2009/0008705 A1 | 1/2009 | Zhu et al. | |
| 2009/0095980 A1 | 4/2009 | Yu et al. | |
| 2009/0152589 A1 | 6/2009 | Rakshit et al. | |
| 2009/0166761 A1 | 7/2009 | Curatola et al. | |
| 2009/0278196 A1 | 11/2009 | Chang et al. | |
| 2010/0038687 A1 | 2/2010 | Klaus et al. | |
| 2010/0144121 A1 | 6/2010 | Chang et al. | |
| 2010/0163842 A1 | 7/2010 | Lai et al. | |
| 2010/0163971 A1 | 7/2010 | Hung et al. | |
| 2010/0264468 A1 | 10/2010 | Xu | |
| 2011/0073952 A1 | 3/2011 | Kwok et al. | |
| 2011/0081764 A1 | 4/2011 | Maszara et al. | |
| 2011/0101455 A1 | 5/2011 | Basker et al. | |
| 2011/0108920 A1 | 5/2011 | Basker et al. | |
| 2011/0127610 A1 | 6/2011 | Lee et al. | |
| 2011/0147811 A1 | 6/2011 | Kavalieros et al. | |
| 2011/0193141 A1 | 8/2011 | Lin et al. | |
| 2011/0193178 A1 | 8/2011 | Chang et al. | |
| 2011/0207309 A1 | 8/2011 | Izumida et al. | |
| 2011/0233679 A1 | 9/2011 | Chen et al. | |
| 2012/0086053 A1 | 4/2012 | Tseng et al. | |
| 2012/0091528 A1 | 4/2012 | Chang et al. | |
| 2012/0104472 A1 | 5/2012 | Xu et al. | |
| 2012/0193751 A1 | 8/2012 | Kawasaki et al. | |
| 2012/0241818 A1 | 9/2012 | Kavalieros et al. | |
| 2012/0276695 A1 | 11/2012 | Cheng et al. | |
| 2012/0280211 A1 | 11/2012 | Cohen et al. | |
| 2012/0292672 A1 | 11/2012 | Cho | |
| 2012/0319211 A1 | 12/2012 | van Dal et al. | |
| 2013/0001591 A1 | 1/2013 | Wu et al. | |
| 2013/0005114 A1 | 1/2013 | Maszara et al. | |
| 2013/0011983 A1 | 1/2013 | Tsai et al. | |
| 2013/0011984 A1 | 1/2013 | Wang et al. | |
| 2013/0200455 A1 | 8/2013 | Lo et al. | |
| 2013/0228863 A1 | 9/2013 | Wang | |
| 2013/0277748 A1 | 10/2013 | Lee et al. | |
| 2013/0334606 A1 | 12/2013 | Shen et al. | |
| 2014/0008734 A1 | 1/2014 | Lu | |
| 2014/0011341 A1 | 1/2014 | Maszara et al. | |
| 2014/0027860 A1 | 1/2014 | Glass et al. | |
| 2014/0065782 A1 | 3/2014 | Lu et al. | |
| 2014/0131776 A1 | 5/2014 | Ching et al. | |
| 2014/0134824 A1 | 5/2014 | Chen et al. | |
| 2014/0151766 A1 | 6/2014 | Eneman et al. | |
| 2014/0175554 A1 | 6/2014 | Loubet et al. | |
| 2014/0197456 A1 | 7/2014 | Wang et al. | |
| 2014/0197457 A1 | 7/2014 | Wang et al. | |
| 2014/0203334 A1 | 7/2014 | Colinge et al. | |
| 2014/0217517 A1 | 8/2014 | Cai et al. | |
| 2014/0252481 A1 | 9/2014 | Flachowsky et al. | |
| 2014/0273397 A1 | 9/2014 | Rodder et al. | |
| 2014/0357029 A1 | 12/2014 | Loubet et al. | |
| 2014/0367800 A1 | 12/2014 | Lee et al. | |
| 2014/0377926 A1 | 12/2014 | Kim et al. | |
| 2015/0008483 A1 | 1/2015 | Ching et al. | |
| 2015/0024573 A1 | 1/2015 | Jacob et al. | |
| 2015/0028426 A1 | 1/2015 | Ching et al. | |
| 2015/0048453 A1 | 2/2015 | Ching et al. | |
| 2015/0054039 A1 | 2/2015 | Ching et al. | |
| 2015/0069474 A1 | 3/2015 | Ching et al. | |
| 2015/0144999 A1 | 5/2015 | Ching | |
| 2015/0303305 A1 | 10/2015 | Ching et al. | |
| 2015/0311335 A1 | 10/2015 | Ching et al. | |

FOREIGN PATENT DOCUMENTS

| | | |
|---|---|---|
| KR | 20110111550 A | 10/2011 |
| KR | 20130036694 A | 4/2013 |
| KR | 20130091620 A | 8/2013 |

OTHER PUBLICATIONS

Tsai, J. C. C. et al. "Point Defect Generation during Phosphorus Diffusion in Silicon," Journal of the Electrochemical Society 1987, vol. 134, Issue 6, Jun. 1987, pp. 1508-1518.

Deal, B.E. et al., "Thermal Oxidation of Heavily Doped Silicon," Journal of the Electrochemical Society 1965, vol. 112, Issue 4, Sep. 1964, pp. 430-435.

(56) References Cited

OTHER PUBLICATIONS

Tanaka et al., Abnormal oxidation characteristics of SiGe/Si-on-insulator structures depending on piled-up Ge fraction at SiO2/SiGe interface, AIP Journal of Applied Physics, vol. 103, Mar. 2008, 6 pages.

Tetelin, C. et al., "Kinetics and mechanism of low temperature atomic oxygen-assisted oxidation of SiGe layers," Journal of Applied Physics, vol. 83, No. 5, Mar. 1, 1998, pp. 2842-2846.

FIN SPACER PROTECTED SOURCE AND DRAIN REGIONS IN FINFETS

CROSS REFERENCES TO RELATED APPLICATIONS

This application is a continuation of U.S. patent application Ser. No. 15/911,488, filed Mar. 5, 2018, and titled "Fin Spacer Protected Source and Drain Regions in FinFETs," which is a continuation of U.S. patent application Ser. No. 14/851,535, filed Sep. 11, 2015, and titled "Fin Spacer Protected Source and Drain Regions in FinFETs," now U.S. Pat. No. 9,935,011, issued on Apr. 3, 2018, which is a divisional of U.S. patent application Ser. No. 14/056,649, filed Oct. 17, 2013, and titled "Fin Spacer Protected Source and Drain Regions in FinFETs," now U.S. Pat. No. 9,147,682, issued on Sep. 29, 2015, which applications are incorporated herein by reference.

This application is related to U.S. patent application Ser. No. 13/740,373, filed Jan. 14, 2013, and entitled "Semiconductor Device and Fabricating the Same,"; U.S. patent application Ser. No. 13/902,322, filed May 24, 2013, and entitled "Semiconductor Device and Method of Fabricating Same,"; U.S. patent application Ser. No. 13/934,992, filed Jul. 3, 2013, entitled "Fin Structure of Semiconductor Device,"; U.S. patent application Ser. No. 13/970,295, filed Aug. 19, 2013, entitled "FinFETs and Methods for Forming the Same,"; U.S. patent application Ser. No. 13/952,753, filed Jul. 29, 2013; U.S. patent application Ser. No. 14/024,148, filed Sep. 11, 2013, entitled "Isolation Structure of Fin Field Effect Transistor,"; and U.S. patent application Ser. No. 14/090,072, filed Nov. 26, 2013.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating the FinFET devices have been generally adequate for their intended purposes, they have not been entirely satisfactory in all respects. Improvements in this area are desired.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 1:
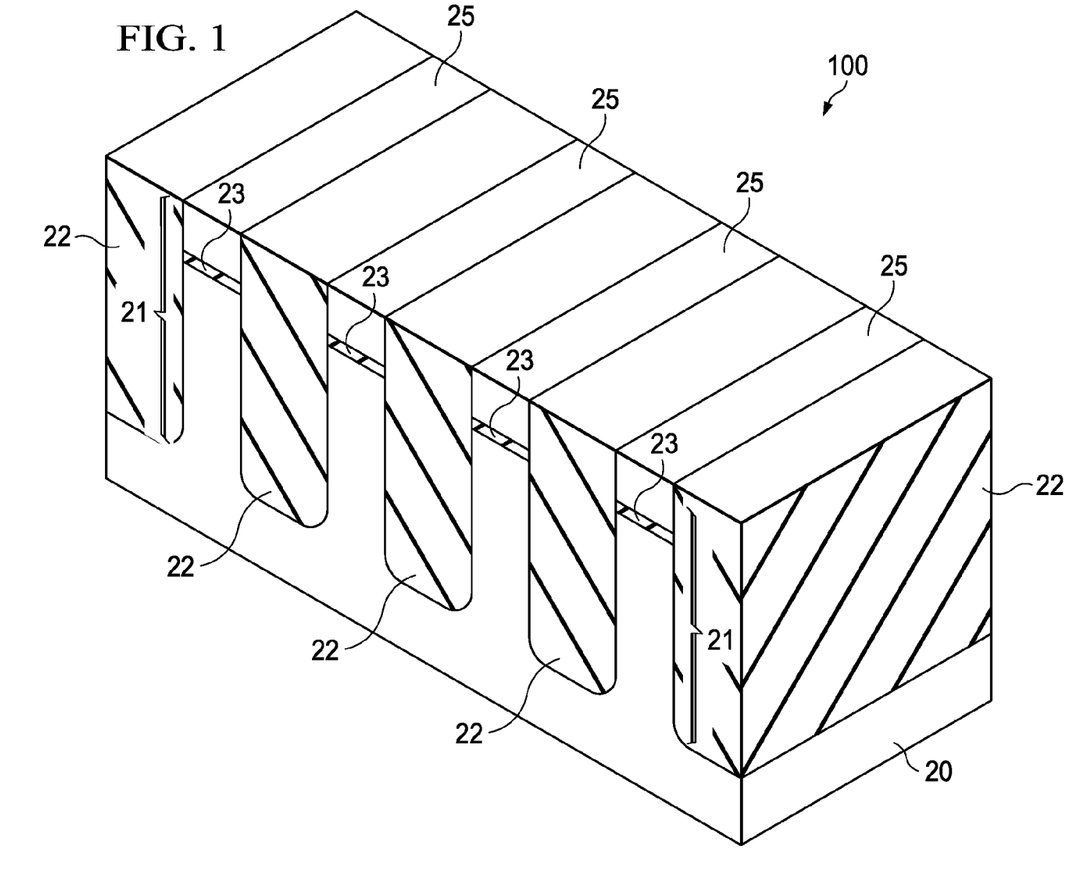
FIGS. 1 through 11 are cross-sectional views and perspective views of intermediate stages in the manufacturing of a Fin Field-Effect Transistor (FinFET) in accordance with some exemplary embodiments.

FIGS. 1 through 11 are perspective views and cross-sectional views of intermediate stages in the manufacturing of a FinFET in accordance with some exemplary embodiments. FIG. 1 illustrates a perspective view of an initial structure. The initial structure includes wafer 100, which includes substrate 20. Substrate 20 may be a semiconductor substrate, which may further be a silicon substrate. Substrate 20 may be doped with a p-type or an n-type impurity. Isolation regions such as Shallow Trench Isolation (STI) regions 22 are formed to extend from a top surface of substrate 20 into substrate 20, wherein top surface of substrate 20 is also a major surface 100A of wafer 100. The portions of substrate 20 between neighboring STI regions 22 are referred to as semiconductor strips 21. The top surfaces of STI regions 22 may be leveled with the top surfaces of hard mask layers 25, which are used as a Chemical Mechanical Polish (CMP) stop layer during the formation of STI regions 22. Pad oxide layers 23 are formed between hard mask layers 25 and semiconductor strips 21.

Figure 2:
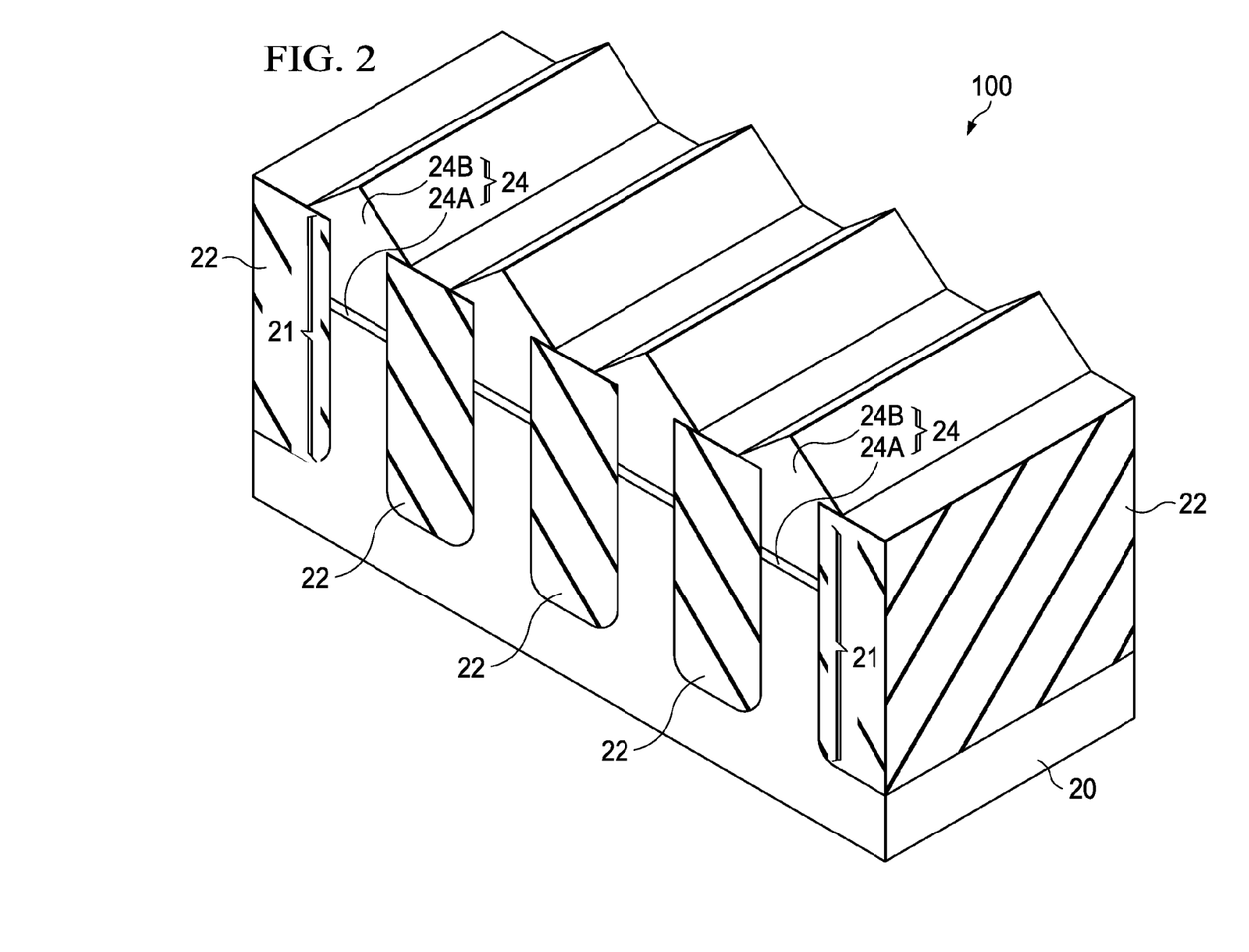

FIG. 2 illustrates the replacement of the top portion of semiconductor strips 21 in FIG. 1 with semiconductor strips 24. In the replacement of semiconductor strips 21, pad oxide layers 23 and hard mask layers 25 (FIG. 1) are removed first. At least the top portions, or substantially entireties, of semiconductor strips 21 are then removed to form recesses (not shown, occupied by semiconductor strips 24). Next, an epitaxy is performed to epitaxially grow semiconductor strips 24 in the recesses, forming the structure in FIG. 2.

The formation of semiconductor strips 24 includes depositing a semiconductor layer 24A to partially fill in the trenches, and a semiconductor layer 24B on the top of first semiconductor material 24A. The first and second semiconductor layers 24A and 24B may be deposited by epitaxial growing processes. The epitaxial processes include Chemical Vapor Deposition (CVD) techniques (e.g., Vapor-Phase Epitaxy (VPE) and/or Ultra-High Vacuum CVD (UHV-CVD)), molecular beam epitaxy, and/or other suitable processes. In some embodiments, semiconductor layer 24A is a silicon germanium (SiGe) layer, and semiconductor layer 24B is a silicon layer free from or substantially free from germanium (for example, with a germanium percentage lower than about 5 percent). Semiconductor layer 24A may have a germanium percentage in the range between about 15 percent and about 60 percent, although the germanium percentage may be higher or lower. The thickness of semiconductor layer 24A may be in the range between about 10 nm and about 40 nm.

After the formation of the structure as shown in FIG. 2, a CMP process is performed to remove excessive semiconductor layer 24B, and to planarize the top surfaces of semiconductor layer 24B and STI regions 22.

Figure 3:
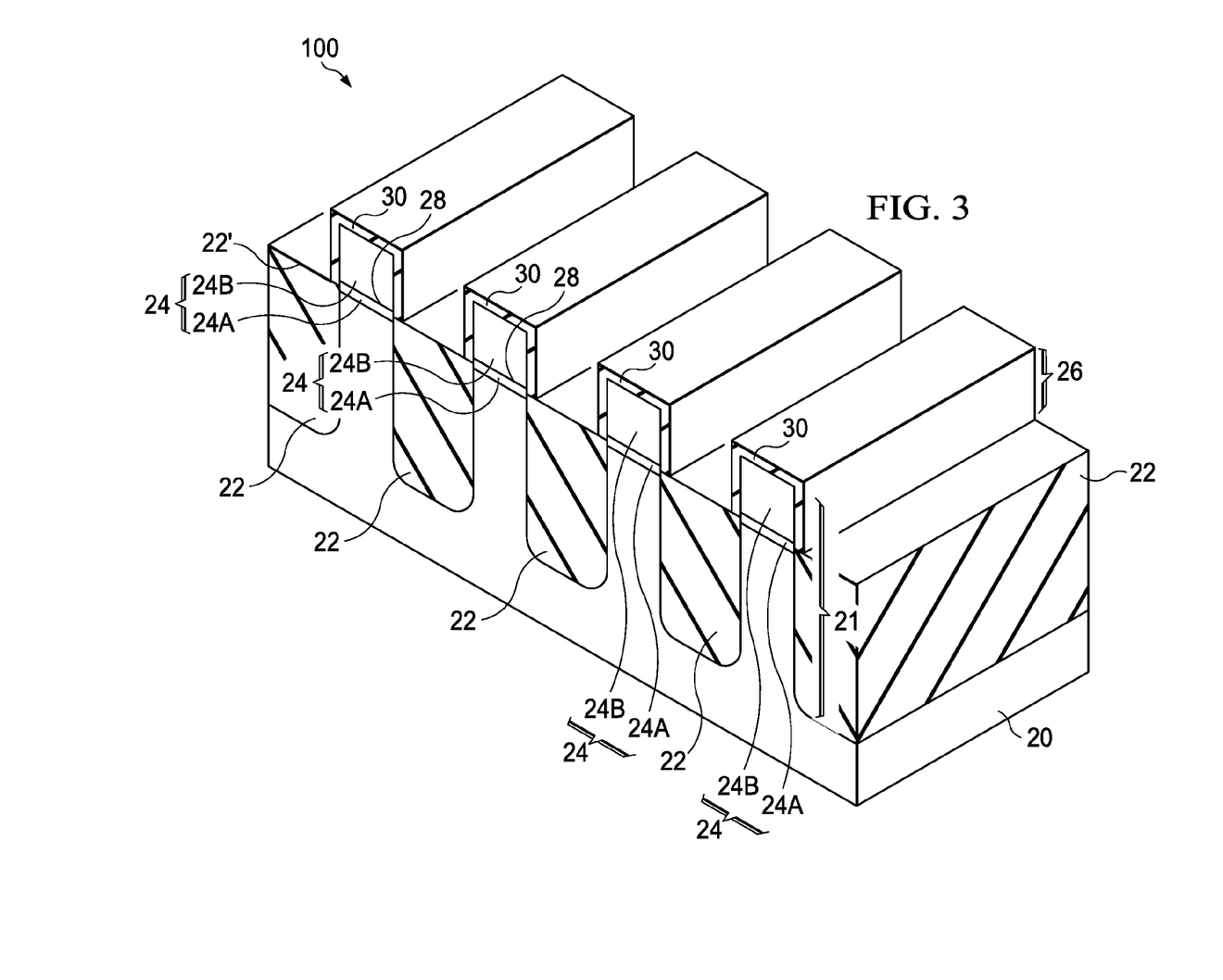

Referring to FIG. 3, STI regions 22 are recessed, so that the top portions of semiconductor strips 24 are higher than the top surfaces of STI regions 22 to form semiconductor fins 26. In accordance with some embodiments, interface 28 between semiconductor layer 24B the respective underlying semiconductor layer 24A are higher than top surface 22A' of the recessed STI regions 22. In alternative embodiments, interfaces 28 are level with or lower than top surfaces 22A'. Dummy oxide layer 30 may be formed on the sidewalls and the top surfaces of semiconductor fins 26. Dummy oxide layer 30 may be formed, for example, through deposition.

Figure 4:
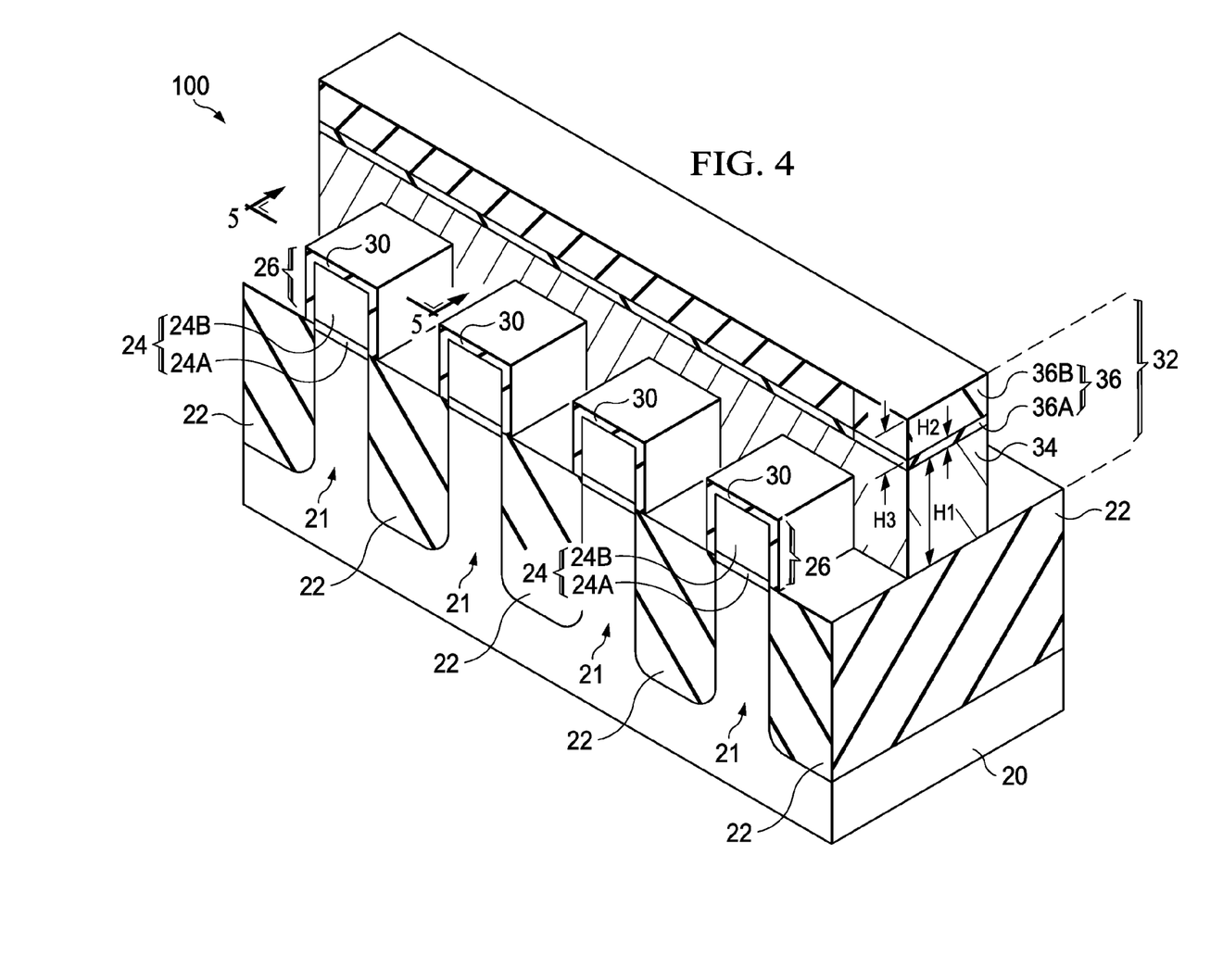

Referring to FIG. 4, gate stack 32 is formed on the top surface and the sidewalls of semiconductor fins 26. In some embodiments, gate stack 32 includes dummy gate electrode 34 over dummy dielectric 30. Dummy gate electrode 34 may be formed, for example, using polysilicon. In some embodiments, height (thickness) H1 of dummy gate electrode 34 is in the range between about 80 nm and about 120 nm. Gate stack 32 may also comprise hard mask layer 36 over dummy gate electrode 34. Hard mask layer 36 may include silicon nitride and/or silicon oxide, for example, and may be a single layer or a composite layer including a plurality of layers. In some embodiments, hard mask layer 36 includes silicon nitride layer 36A and silicon oxide layer 36B over silicon nitride layer 36A. Height H2 of silicon nitride layer 36A may be in the range between about 10 nm and about 30 nm, and height H3 of silicon oxide layer 36B may be in the range between about 80 nm and about 120 nm. Gate stack 32 may cross over a plurality of semiconductor fins 26 and STI regions 22. Gate stack 32 has a lengthwise direction substantially perpendicular to the lengthwise direction of semiconductor fins 26. In accordance with the embodiments of the present disclosure, gate stack 32 is a dummy gate stack, and will be replaced by a replacement gate in a subsequent step.

Figure 5:
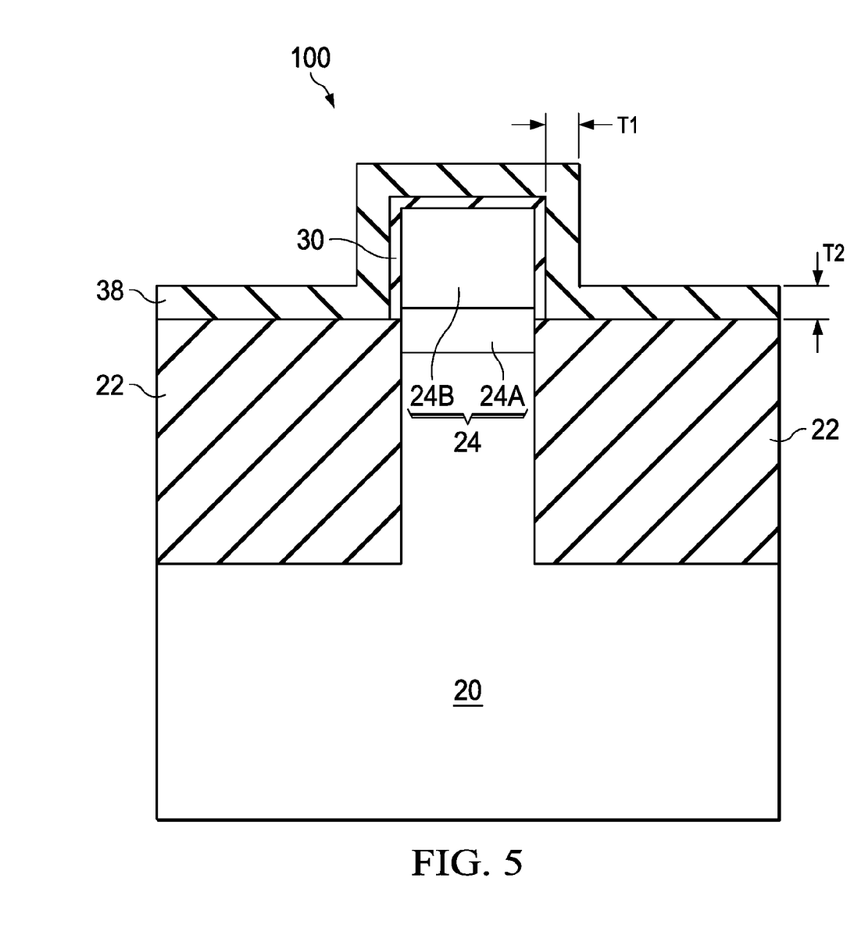
Figure 6:
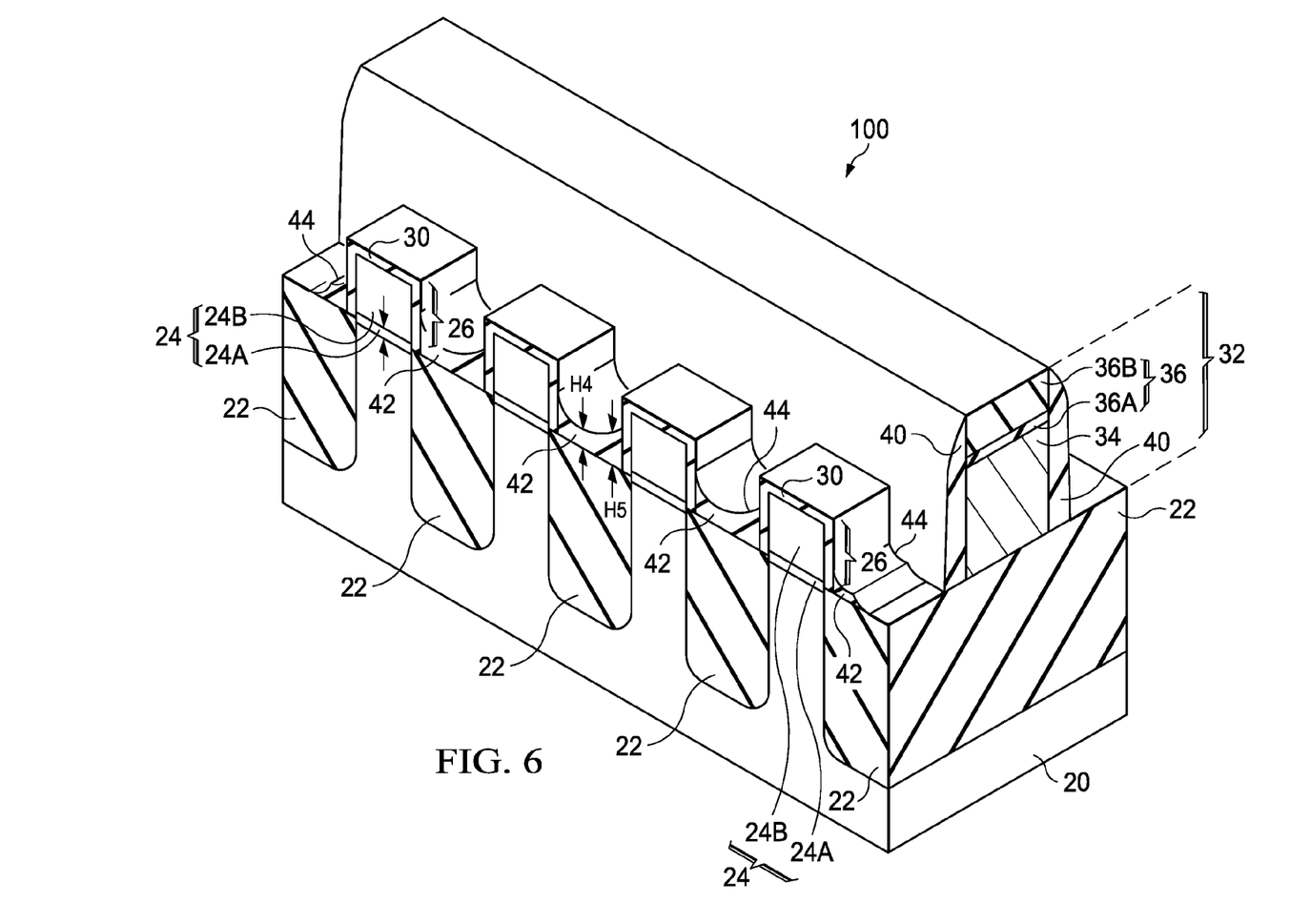

FIGS. 5 and 6 illustrate the formation of gate spacers 40 and 42. Referring to FIG. 5, spacer layer 38 is formed as a blanket layer to cover the structure shown in FIG. 4. FIG. 5 illustrates a cross-sectional view taken along a plane, which is the same plane containing line A-A in FIG. 4. In some embodiments, spacer layer 38 is formed of silicon nitride, and may have a single-layer structure. In alternative embodiments, spacer layer 38 is a composite layer including a plurality of layers. For example, spacer layer 38 may include a silicon oxide layer, and a silicon nitride layer over the silicon oxide layer. Spacer layer 38 may be formed as a substantially conformal layer, and hence thickness T1 of the vertical portions of spacer layer 38 on the sidewalls of semiconductor fin 26 and gate stack 32 is close to thickness T2 of the horizontal portion of spacer layer 38. For example, thickness T1 and T2 may have a difference smaller than about 20 percent of thickness T2.

Next, spacer layer 38 is patterned, forming gate spacers 40 and fin spacers 42, as shown in FIG. 6. In some embodiments in which spacer layer 38 (FIG. 5) includes silicon nitride, the patterning of the silicon nitride layer includes a dry etching using $CH_2F_2$ as an etchant. In other embodiments in which spacer layer 38 (FIG. 5) includes a silicon oxide layer and a silicon nitride layer, the patterning of spacer layer 38 includes a dry etching using $CH_2F_2$ as an etchant to pattern silicon nitride, followed by a dry etching using $CF_4$ as an etchant to pattern the silicon oxide layer. The patterning includes an anisotropic effect, so that the horizontal portions of spacer layer 38 are removed, while the vertical portions on the sidewalls of gate stack 32 remain to form gate spacers 40. The vertical portions of spacer layer 38 on the sidewalls of semiconductor fin 26 remain to form fin spacers 42.

The process conditions for patterning gate spacer layer 38 are controlled, so that the top ends 44 of fin spacers 42 are lower than the top surfaces of semiconductor fins 26. Furthermore, the top ends 44 are higher than the top surface of semiconductor layer 24A, which may be a silicon germanium layer. Accordingly, the sidewalls of the entire semiconductor layer 24A are protected by fin spacers 42 and STI regions 22. The resulting fin spacers 42 between two neighboring fins 26 may have a dishing-shape in the cross-sectional view, with the edge portions of fin spacers 42 being highest (with height H4), and the center portion of fin spacers 42 in the middle of neighboring fins 26 being the lowest (with height H5). In some embodiments, the center height H5 of fin spacers 42 is in the range between about 5 nm and about 15 nm. Edge height H4 may be greater than center height H5 by a difference in the range between about 2 nm and about 8 nm.

Figure 7:
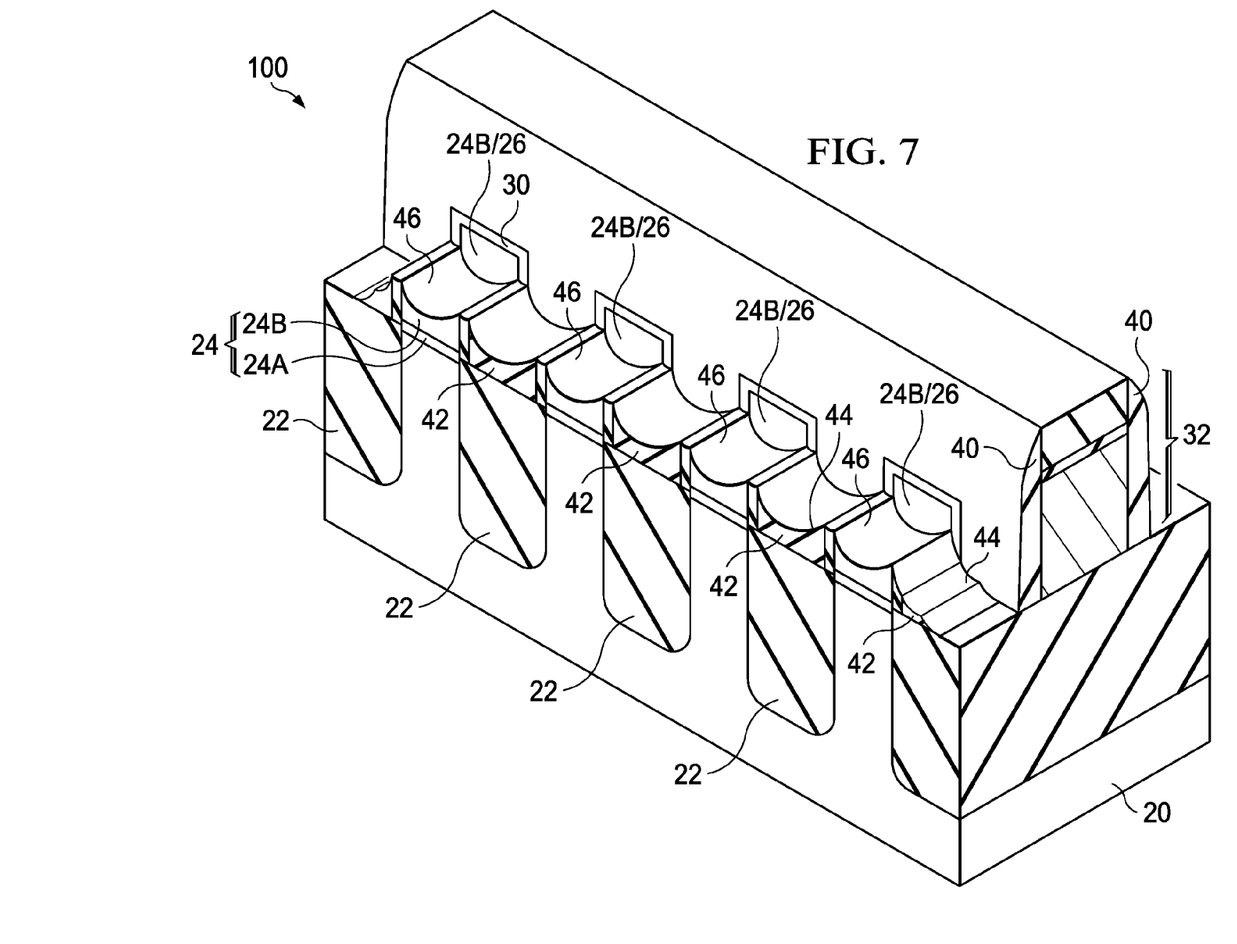

Referring to FIG. 7, the exposed portions of dummy oxide layer 30, if any, are removed through etching. An etching step is then performed to etch the portions of semiconductor strips 24 (FIG. 3) that are not covered by gate stack 32 and gate spacers 40. When the etching stops, semiconductor layers 24B, which may be silicon layers, still have the bottom portion left, with the thickness of the remaining semiconductor layers 24B being in the range between about 2 nm and about 8 nm, for example. Accordingly, semiconductor layers 24A are not exposed. In some embodiments, the top ends 44 of fin spacers 42 are higher than the top surfaces of the remaining semiconductor layers 24B, hence recesses 46 are formed between neighboring fin spacers 42.

Figure 8:
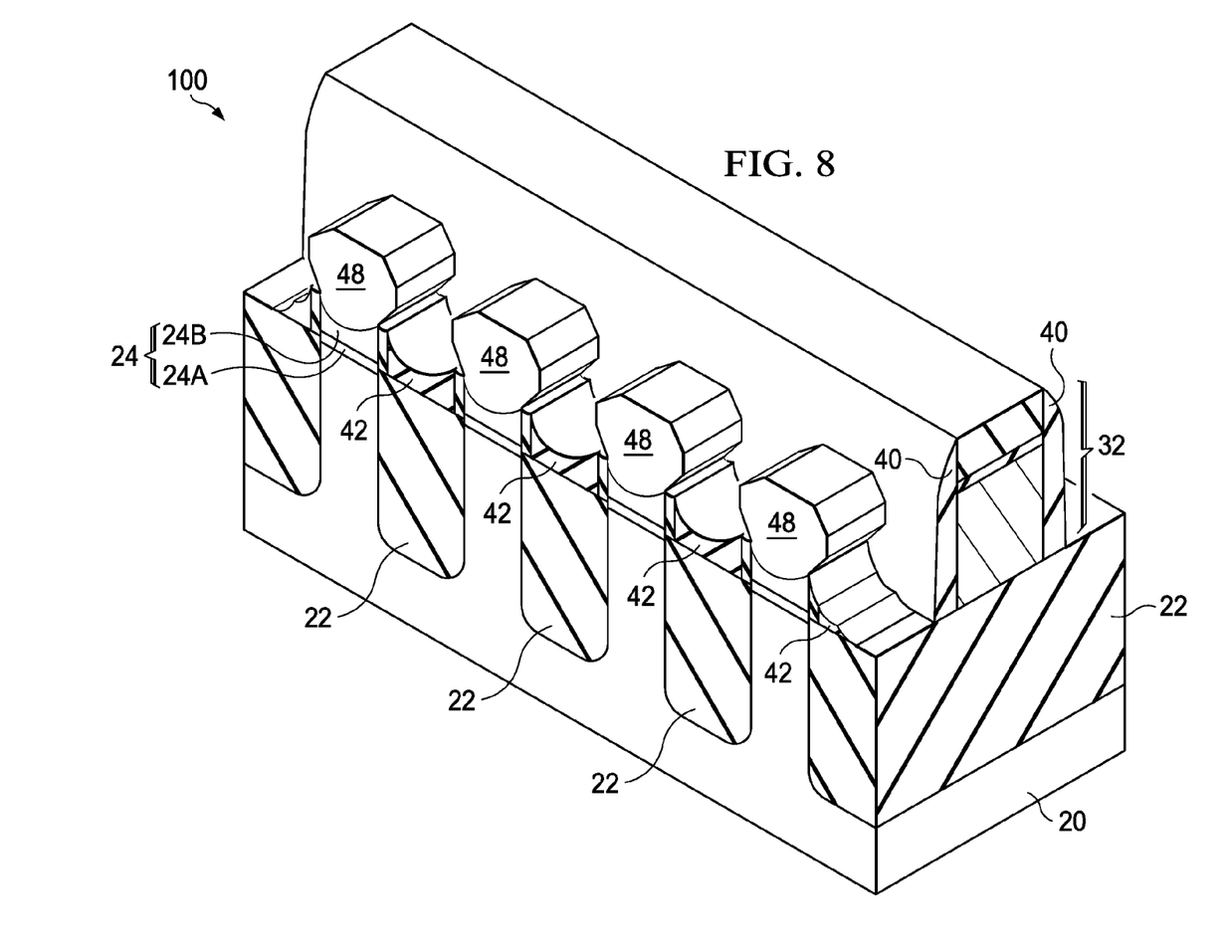

Next, referring to FIG. 8, epitaxy regions 48 are formed by selectively growing a semiconductor material from recesses 46 (FIG. 7) that are left by the removed portions of semiconductor strips 24. In some exemplary embodiments, epitaxy regions 48 comprise silicon phosphorous (SiP) or phosphorous-doped silicon carbide (SiCP). The further epitaxial growth of epitaxy regions 48 causes epitaxy regions 48 to expand horizontally, and facets start to form. As illustrated in FIG. 8, due to the blocking of fin spacers 42, epitaxy regions 48 are first grown vertically in recesses 46, during which time epitaxy regions 48 do not grow horizontally. After recesses 46 are fully filled, the subsequently grown epitaxy regions 48 are grown both vertically and horizontally. Hence, the horizontal growth is delayed.

In some embodiments, during the growth of epitaxy regions 48, an n-type impurity such as phosphorous is in-situ doped to form source and drain regions, which are also denoted using reference numeral 48. The resulting FinFET is hence an n-type FinFET.

Figure 9:
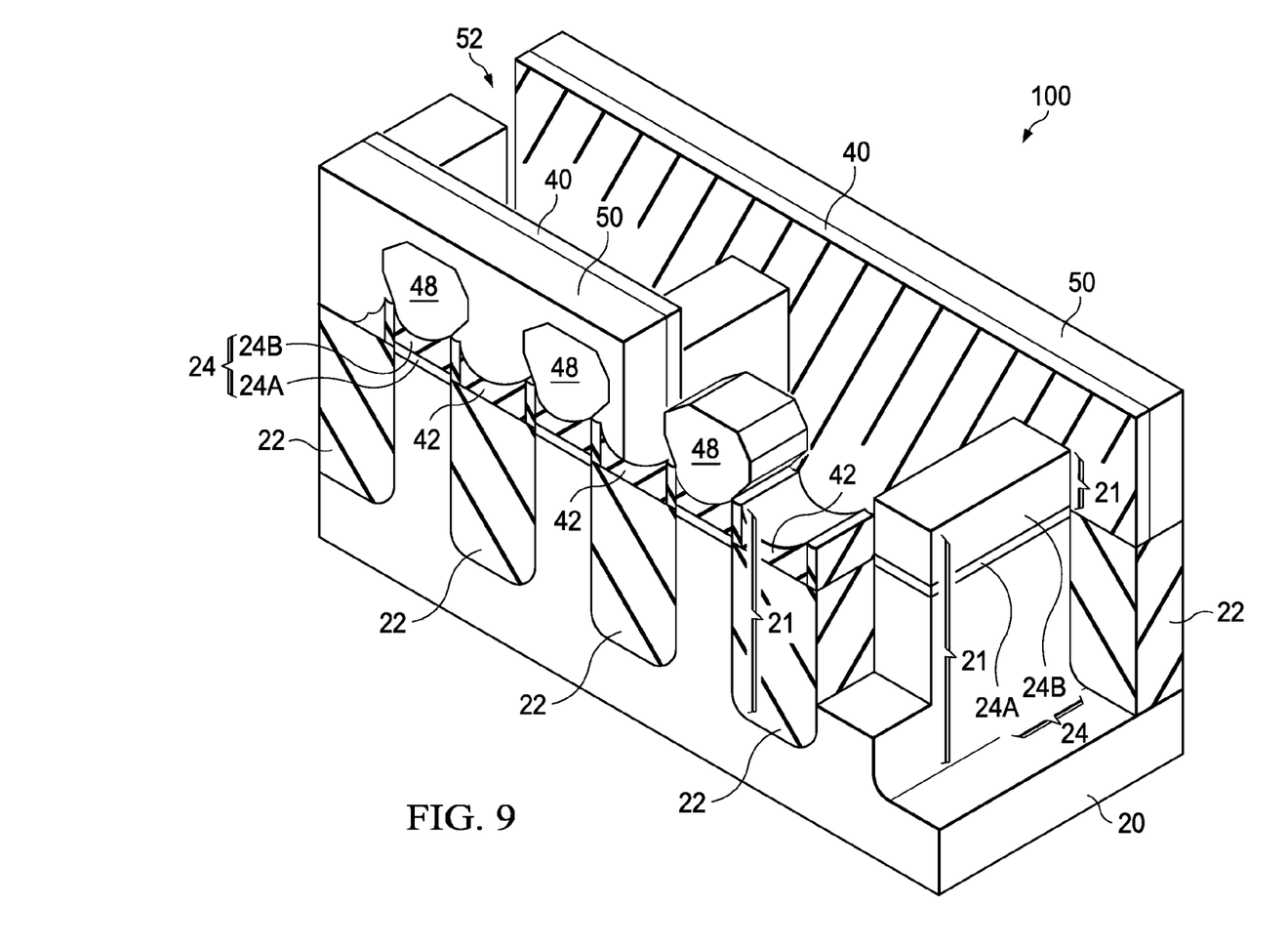

Hard mask layer 36 (shown in FIG. 8) is removed by photo patterning and dry etching processes, and top surface of dummy gate electrode 34 (FIG. 8) is exposed. Next, as shown in FIG. 9, Inter-Layer Dielectric (ILD) 50 is formed. Although not shown, a buffer oxide layer and a Contact Etch Stop Layer (CESL) may also be formed before the formation of ILD 50. ILD 50 may comprise a Flowable oxide formed using, for example Flowable Chemical Vapor Deposition (FCVD). A CMP may then be performed to level the top surfaces of ILD 50, top surface of dummy gate electrode 34 (FIG. 8), and gate spacers 40 with each other. Each of ILD 50, fin spacers 42, and insulation regions 22 may have distinguishable interfaces with the other ones of ILD 50, fin spacers 42, and insulation regions 22 since they are formed in different process steps, having different densities, and/or comprise different dielectric materials.

Next, dummy gate electrode 34 as shown in FIG. 8 is removed in an etching step, so that recess 52 is formed to extend into ILD 50, as shown in FIG. 9. To illustrate the features behind the front portion of ILD 50, some front portions of ILD 50, semiconductor strips 21, source/drain regions 48, source/drain regions 48, STI regions 22, and the like are not shown in FIGS. 9, 10, and 11, so that the inner features may be illustrated. It is appreciated that the un-illustrated portions of ILD 50, semiconductor strips 21, source/drain regions 48, and STI regions 22 still exist. After the removal of dummy gate stack 32, the middle portions of semiconductor fins 26 are exposed to recess 52. During the removal of dummy gate electrode 34, dummy gate oxide 30 (FIG. 3) is used as an etch stop layer when the top layer is etched. Dummy gate oxide 30 is then removed.

Figure 10:
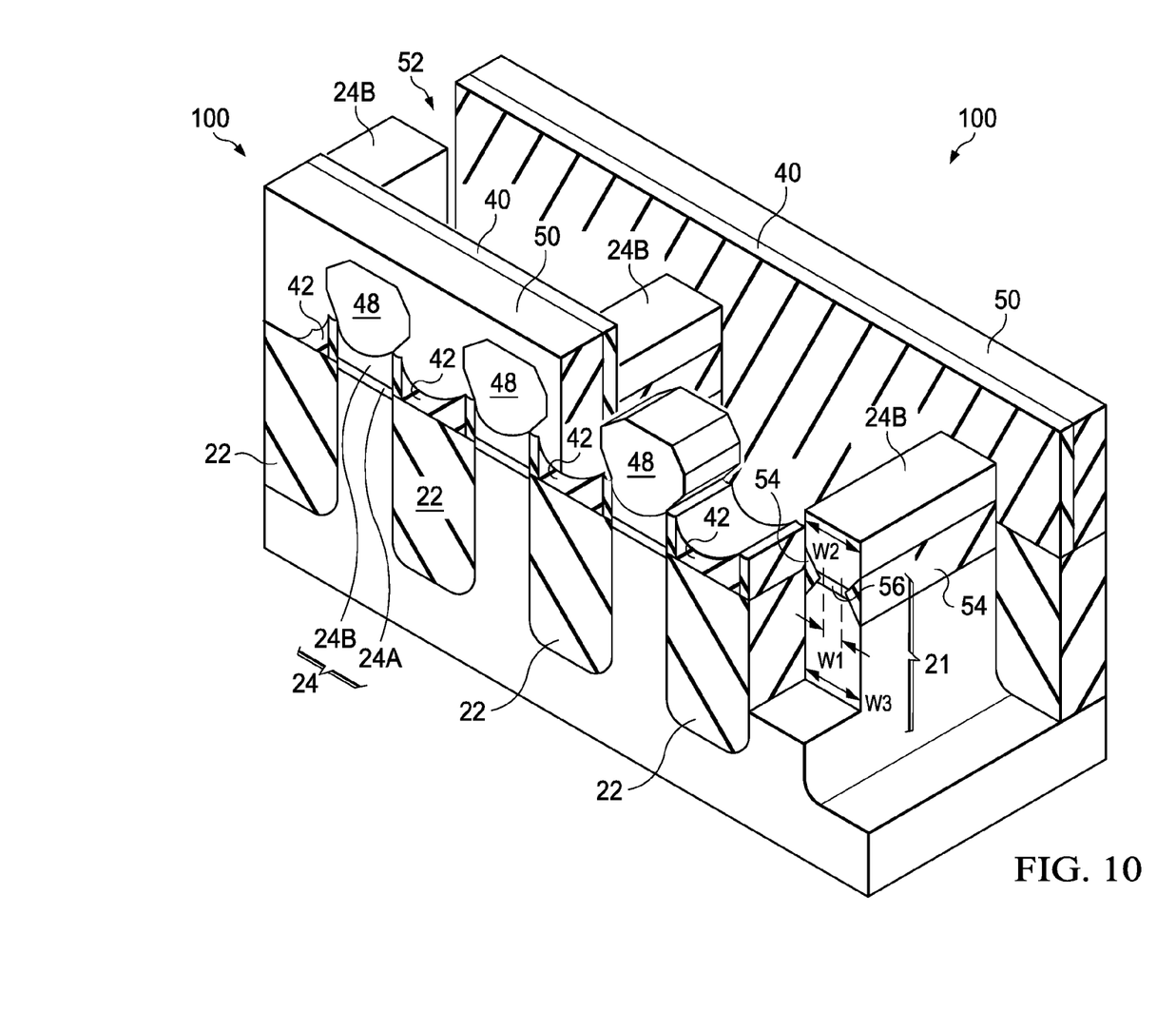

Referring to FIG. 10, a thermal oxidation process is performed on the exposed first and second semiconductor layers 24A and 24B. In some embodiments, the thermal oxidation process is conducted in an oxygen-containing ambient. In other embodiments, the thermal oxidation process is conducted in a combination of a steam ambient and an oxygen-containing ambient. During the thermal oxidation process, outer portions of semiconductor layer 24A (FIG. 7) are converted to semiconductor oxide regions 54, while some inner portion is not converted to oxide. Semiconductor oxide regions 54 may be silicon oxide regions, and include portions on opposite sides of semiconductor region 56. Semiconductor oxide regions 54 may also form a ring encircling semiconductor region 56, with the ring include a portion overlying and a portion underlying semiconductor region 56 in addition to the portions on opposite sides of semiconductor region 56.

During the thermal oxidation process, the semiconductor layer 24A obtains a volume expansion. In some embodiments, the semiconductor layers 24A and 24B and the thermal oxidation process are configured so that the semiconductor layer 24A obtains a volume expansion to achieve a desired degree of channel strain, such as 1 Gpa of tensile strain. It is realized, however, that the ratios of the volume expansion may change in different embodiments.

In some embodiments, the oxidation is performed at a temperature in the range between about 400° C. and 600° C. The oxidation time may range between about 2 minutes and about 4 hours, for example. The oxidation of silicon in silicon germanium is easier than the oxidation of germanium in the same silicon germanium region. Accordingly, the silicon atoms in semiconductor layers 24A are oxidized, and the germanium atoms in semiconductor layers 24A remain substantially un-oxidized. The germanium atoms may diffuse inwardly toward the centers of semiconductor layers 24A to form semiconductor region 56, in which germanium atoms are concentrated. Accordingly, semiconductor region 56 has a germanium percentage higher than that of semiconductor layer 24A (FIG. 9), and may possibly a pure germanium region. The germanium atoms may also diffuse to the interface regions between semiconductor layers 24A and the underlying semiconductor region 21, and the interface between semiconductor layers 24A and the overlying semiconductor layer 24B. During the oxidation, a silicon oxide layer (not shown) is formed on the top surface and the sidewalls of semiconductor layer 24B. The oxide layer may be kept, with the subsequently formed replacement gate formed on the oxide layer. The oxide layer may also be removed before the subsequent formation of the replacement gate, as shown in FIG. 11.

As a result of the oxidation, the width W1 of germanium/silicon germanium region 56 is smaller than width W2 of the underlying portion of semiconductor strip 21 and width W3 of semiconductor layer 24B. In these embodiments, region 56 may form the bottom portion of the resulting semiconductor fins 26.

Figure 11:
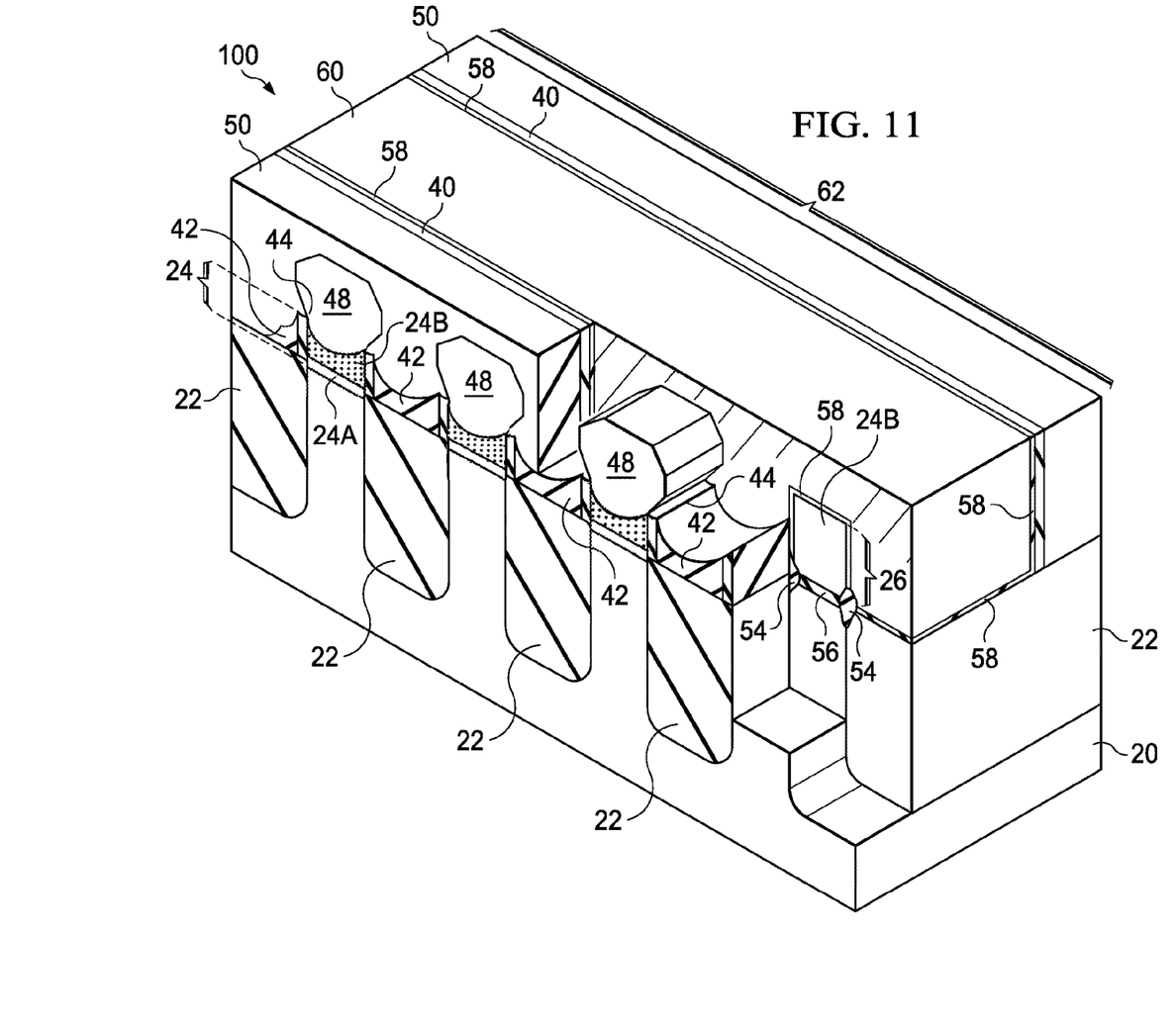

FIG. 11 illustrates the formation of the replacement gate comprising gate dielectric 58 and gate electrode 60. The intermediate stages in the formation of gate dielectric 58 and gate electrode 60 are not illustrated, and are described briefly below referring to FIG. 11. Gate dielectric 58 is then formed as a blanket layer in recess 52 (FIG. 10) and on the top surfaces and the sidewalls of semiconductor fins 26. In accordance with some embodiments, gate dielectric layer 58 comprises silicon oxide, silicon nitride, or multilayers thereof. In alternative embodiments, gate dielectric layer 58 comprises a high-k dielectric material. In which embodiments, gate dielectric layer 58 may have a k value greater than about 7.0, and may include a metal oxide or a silicate of Hf, Al, Zr, La, and the like. Next, conductive material 60 is formed over gate dielectric layer 58, and fills the remaining recess 52 (FIG. 10). Conductive material 60 may comprise a metal-containing material such as TiN, TaN, TaC, Co, Ru, Al, Cu, W, combinations thereof, or multi-layers thereof. After the filling of conductive material 60, a CMP is performed to remove the excess portions of gate dielectric layer 58 and conductive material 60, which excess portions are over the top surface of ILD 50. The resulting remaining portions of conductive material 60 and gate dielectric layer 58 thus form a replacement gate for the resulting FinFET 62.

The embodiments of the present disclosure have some advantageous features. By forming the fin spacers that prevent silicon germanium layer 24A to be exposed in the step (shown in FIG. 7) of etching semiconductor fins 26, silicon germanium layers 24A are protected from being etched. If silicon germanium layers 24A are not protected, silicon germanium layers 24A will be etched more than the overlying layer 24B. A hole will be formed under semiconductor layer 24B, which hole will be later filled (may be partially) by epitaxy regions 48 (FIG. 8). The filled epitaxy region 48 in the hole causes the subsequently formed source/drain regions and gate electrode to be too close to each other, and hence causes the increase in the gate-to-source/drain leakage or the shorting of gate and source/drain.

In addition, the fin spacers prevent the pre-mature lateral expansion of the epitaxy source/drain regions. If the epitaxy source/drain regions are laterally expanded starting from a very low level, some of the laterally expanded source/drain regions may merge long before other source/drain regions merge with each other. The merged source/drain regions have much higher growth rates than the un-merged source/drain regions, resulting in a non-uniform growth in source/drain regions. Hence, the fin spacers are beneficial for the uniform growth of source/drain regions.

In accordance with some embodiments, a method includes etching a semiconductor substrate to form a first plurality of recesses and filling the first plurality of recesses to form Shallow Trench Isolation (STI) regions. A portion of the semiconductor substrate between the STI regions forms a semiconductor strip, with edges of the semiconductor strip contacting sidewalls of the STI regions. The method also includes replacing a top portion of the semiconductor strip with a first semiconductor layer and a second semiconductor layer. The second semiconductor layer is formed over the first semiconductor layer, and the first semiconductor layer has a first germanium percentage higher than a second germanium percentage of the second semiconductor layer. The method also includes recessing the STI regions. A portion of the semiconductor strip with edges exposed by the recessed STI regions forms a semiconductor fin. The method further includes forming a gate stack over a middle portion of the semiconductor fin, forming gate spacers on sidewalls of the gate stack, forming fin spacers on sidewalls of an end portion of the semiconductor fin, recessing the end portion of the semiconductor fin, and growing an epitaxial region over the end portion of the semiconductor fin that is recessed.

In accordance with other embodiments, a method of forming a Fin Field-Effect Transistor (FinFET) device includes forming a first and a second semiconductor fin over a substrate, the first and second semiconductor fins being parallel to each other, and forming Shallow Trench Isolation (STI) regions surrounding the first and the second semiconductor fins. Top portions of the first and the second semiconductor fins comprise a first epitaxial layer and a second epitaxial layer, with the first epitaxial layer underlying the second epitaxial layer and having a first germanium percentage. The method also includes forming a gate stack over respective middle portions of the first and the second semiconductor fins, and forming a fin spacer between end portions of the first and the second semiconductor fins. The end portions of the first and the second semiconductor fins are disposed on a same side of the gate stack. The fin spacer extends continuously on a first sidewall of the first semiconductor fin, a top surface of the STI regions, and a second sidewall of the second semiconductor fin. An edge of the fin spacer on the first sidewall has a first height larger than a second height of the fin spacer measured at a point midway between the first and the second semiconductor fins. The method further includes removing top portions of the second epitaxial layer from the respective end portions of first and the second semiconductor fins, and epitaxially growing a first source/drain region and a second source/drain region over remaining portions of the second epitaxial layer of the end portions of the first and the second semiconductor fins, respectively.

In accordance with yet other embodiments, a method of forming a Fin Field-Effect Transistor (FinFET) device includes forming a first and a second semiconductor fin over a substrate, with Shallow Trench Isolation (STI) regions surrounding the first and the second semiconductor fins. Top portions of the first and the second semiconductor fins include a germanium-containing first semiconductor layer and a substantially germanium-free second semiconductor layer, with the first semiconductor layer underlying the second semiconductor layer. The method also includes forming a gate stack over middle portions of the first and the second semiconductor fins and forming fin spacers on sidewalls of end portions of the first and the second semiconductor fins. Top ends of the fins spacers extend above a top surface of the first semiconductor layer. The method further includes removing top portions of the second semiconductor layer, and subsequently, epitaxially growing source/drain regions over the end portions of the first and the second semiconductor fins, removing the gate stack to expose the first and the second semiconductor layers in the middle portions of the first and the second semiconductor fins, and oxidizing outer portions of the first semiconductor layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of manufacturing an integrated circuit device, the method comprising:
    epitaxially growing a first semiconductor material onto a fin;
    epitaxially growing a second semiconductor material onto the first semiconductor material;
    depositing a gate stack over the first semiconductor material and the second semiconductor material;
    forming source/drain regions;
    removing at least a portion of the gate stack; and
    after the removing the at least the portion of the gate stack, oxidizing only a portion of the first semiconductor material.

2. The method of claim 1, wherein the oxidizing is performed at least in part with a steam ambient.

3. The method of claim 2, wherein the oxidizing is performed at least in part with an oxygen-containing ambient in addition to the steam ambient.

4. The method of claim 1, wherein the oxidizing the portion of the first semiconductor material expands a volume of the first semiconductor material.

5. The method of claim 4, wherein the expansion of the volume applies a tensile strain to a channel region.

6. The method of claim 5, wherein the expansion of the volume applies 1 Gpa of tensile strain to the channel region.

7. The method of claim 1, wherein the oxidizing only the portion of the first semiconductor material is performed at least in part at a temperature in the range between about 400° C. and 600° C.

8. A method of manufacturing an integrated circuit device, the method comprising:
    removing a dummy gate stack to expose a fin of semiconductor material, the fin of semiconductor material comprising:
        a first semiconductor material;
        a second semiconductor material over the first semiconductor material, the second semiconductor material being a first epitaxially grown material; and
        a third semiconductor material over the second semiconductor material, the third semiconductor material being a second epitaxially grown material with a smaller germanium percentage than the second semiconductor material; and
    performing an oxidation process while the second semiconductor material is exposed.

9. The method of claim 8, wherein the second epitaxially grown material has a germanium percentage less than about 5%.

10. The method of claim 8, wherein the second semiconductor material has a thickness of between about 10 nm and about 40 nm.

11. The method of claim 8, further comprising, prior to the removing the dummy gate stack, forming a spacer adjacent to the fin.

12. The method of claim 11, wherein the forming the spacers forms a concave surface within the spacer.

13. The method of claim 12, wherein the concave surface is above a top surface of the second semiconductor material.

14. The method of claim 13, wherein an oxide layer is located between the spacer and the third semiconductor material.

15. A method of manufacturing an integrated circuit device, the method comprising:

recessing a portion of a semiconductor fin adjacent to a dummy gate stack, the semiconductor fin comprising a first epitaxially grown material with a first non-zero germanium concentration and a second epitaxially grown material with a second non-zero germanium concentration smaller than the first non-zero germanium concentration;

growing a source/drain region adjacent to the dummy gate stack;

removing the dummy gate stack to expose the first epitaxially grown material; and forming an oxide from a first portion of the first epitaxially grown material.

16. The method of claim 15, wherein the second non-zero germanium concentration is less than about 5%.

17. The method of claim 15, wherein the forming the oxide expands a volume of the first portion of the first epitaxially grown material.

18. The method of claim 15, further comprising forming a spacer adjacent to the semiconductor fin prior to the growing the source/drain region.

19. The method of claim 18, wherein the forming the spacer forms the spacer with a dished surface.

20. The method of claim 19, wherein the dished surface is further away from a shallow trench isolation region than the first epitaxially grown material.

* * * * *